(12) United States Patent
Small et al.

(10) Patent No.: US 6,498,131 B1
(45) Date of Patent: Dec. 24, 2002

(54) COMPOSITION FOR CLEANING CHEMICAL MECHANICAL PLANARIZATION APPARATUS

(75) Inventors: Robert J. Small, Dublin, CA (US); Joo-Yun Lee, San Leandro, CA (US)

(73) Assignee: EKC Technology, Inc., Hayward, CA (US)

( * ) Notice: Subject to any disclaimer, the term of this patent is extended or adjusted under 35 U.S.C. 154(b) by 71 days.

(21) Appl. No.: 09/632,899

(22) Filed: Aug. 7, 2000

(51) Int. Cl.[7] .............................. C11D 1/68; C11D 3/26; H01L 21/00

(52) U.S. Cl. .................. 510/175; 510/178; 510/505

(58) Field of Search .................. 510/176, 175, 510/254, 178, 504, 480, 256, 259, 204, 202, 177; 438/692; 134/1.2, 2

(56) References Cited

U.S. PATENT DOCUMENTS

| 3,721,629 A | | 3/1973 | Goodenough |
| 4,507,219 A | * | 3/1985 | Hughes |
| 5,912,184 A | | 6/1999 | Young |

FOREIGN PATENT DOCUMENTS

WO    99-23688    5/1999

OTHER PUBLICATIONS http://www.semiconductoronline.com/read/nl20000721/195571, "CMP Slurry Cleaning Systems", Texwipe Company LLC, Aug. 2000, 2 pages.

\* cited by examiner

*Primary Examiner*—Gregory E. Webb
(74) *Attorney, Agent, or Firm*—Skjerven Morrell LLP

(57) ABSTRACT

The present invention relates to chemical compositions and methods of use for cleaning CMP equipment, including the interiors of delivery conduits carrying CMP slurry to the necessary sites. The chemical compositions of the present invention are also useful for post-CMP cleaning of the wafer itself. Three classes of cleaning compositions are described, all of which are aqueous solutions. One class operates in a preferable pH range from about 11 to about 12 and preferably contains one or more non-ionic surfactants, one or more simple amines, a surfactant or sticking agent, such as one or more soluble dialcohol organic compounds, and one or more quaternary amines. A second class of cleaning composition operates in a preferable pH range of approximately 8.5 and contains one or more of citric acid, lactic acid, and oxalic acid. A third class of compositions is acidic, having a preferable pH range from about 1.5 to about 3, preferably containing at least one oxidizing acid, at least one chelating agent, at least one sticking agent and at least one anionic surfactant. HF and KOH are substantially absent from the preferred compositions of the present invention. Some compositions of the present invention are shown to be advantageously used for cleaning the slurry distribution system of CMP apparatus.

14 Claims, No Drawings

COMPOSITION FOR CLEANING CHEMICAL MECHANICAL PLANARIZATION APPARATUS

BACKGROUND OF THE INVENTION

1. Technical Field

The present invention relates to the cleaning of equipment in which chemical mechanical planarization ("CMP") is performed. In particular, the present invention relates to chemical compositions for cleaning CMP equipment wherein said compositions have improved cleaning performance and/or reduced hazards to the equipment, human staff and environment.

2. Description of Related Art

Planarization is a necessary step in the fabrication of multilayer integrated circuits ("ICs"), providing a flat, smooth surface that can be patterned and etched with the accuracy required of modem IC components. The conventional planarization technique is CMP (Chemical Mechanical Planarization or Polishing) known in the art and described in text books (for example, "Chemical Mechanical Planarization of Microelectronic Materials," by Joseph M. Steigerwald, Shyam P. Murarka and Ronald J. Gutman, 1997). CMP typically makes use of a polishing pad brought into mechanical contact with the wafer to be planarized with an abrasive/reactive slurry interposed between polishing pad and wafer. Typical CMP slurries contain constituents that react chemically with the substrate to be planarized as well as constituents causing planarization by mechanical abrasion. Relative motion of the polishing pad with respect to the wafer leads to polishing of the wafer through mechanical abrasion and chemical etching.

The abrasive slurry polishing materials used in CMP typically comprise an abrasive such as silica, alumina, or ceria and chemically reactive ingredients. Typically, in a practical production environment, these slurry materials cannot be entirely confined to the polishing pad and often splash onto various portions of the CMP apparatus and dry in place leading to increasing deposits of CMP slurry materials at various locations within and on the CMP apparatus itself. Deposits also tend to accumulate on the interior surfaces of delivery tubes and other means used for directing the CMP slurry to the necessary sites. As such deposits build over time, it is a common problem that portions of such slurry deposits break loose in the typical form of abrasive particles that can fall back onto the polishing pads, wafers and/or platens. These unwanted abrasive particles dislodged from slurry deposits on the CMP apparatus are a source of concern to the CMP engineer in that they may cause, inter alia, uncontrollable wafer scratching. Additionally, some slurry polishing materials such as ferric nitrate slurries typically used for CMP of tungsten layers cause unsightly stains on CMP apparatus. Hence, slurry materials and other substances have to be periodically removed from CMP apparatus where they have been deposited. Whether the removal occurs after each pad change, once a week, once a month, or pursuant to any other maintenance schedule does not negate the fact that the apparatus eventually has to be thoroughly cleaned so that slurry and other unwanted extraneous materials are removed therefrom.

Polishing slurries containing ferric nitrate $Fe(NO_3)_3$ tend to form ferric hydroxide $(Fe(OH)_3)$ and ferric oxide $(Fe_2O_3)$ residues that tend to precipitate within the conduits of slurry distribution systems that carry slurry to individual CMP apparatus and to specific locations within CMP equipment. These flocculent precipitates can break free, traverse through the slurry distribution system and come into contact with the wafers. Undesirable wafer scratching may result. Hence, there is a need for a cleaning composition effective for removing deposits from the interior regions of the slurry-carrying distribution systems associated with CMP apparatus.

Current practice makes use of surfactant solutions for cleaning CMP apparatus. These solutions are typically not chemically designed to break off or to dissolve typical CMP residues. Thus, the residues must be scraped off with, for example, Teflon scrappers. This scraping technique is both laborious and time-consuming, and results in the generation of loose particles that may fall back onto the apparatus and eventually back onto polishing pads, wafers and/or platen. Uncontrollable wafer scratching and reduced product yields are the typical results. Examples of CMP cleaning systems including wiping operations include those commercially available from The Texwipe Company LLC of Upper Saddle River, N.J. for use in cleaning tungsten CMP slurries (TX8606 SCS) and oxide CMP slurries (TX8065 SCS).

Additionally, current methods for cleaning CMP apparatus make use of hydrogen fluoride (HF) solutions and/or potassium hydroxide (KOH) solutions. Typically, concentrated HF (49%), diluted HF (1% to 10%), or a dilute solution of KOH (e.g., a 5% to 10% solution) is employed. The HF solution or KOH solution is typically sprayed onto the various surfaces of the CMP apparatus that require cleaning and subsequently rinsed with de-ionized ("DI") water. The use of hydrogen fluoride (HF) for cleaning CMP apparatus has serious disadvantages as a result of this substance being extremely deleterious to the human bone structure if absorbed through the skin and as a result of it also being deleterious if inhaled. HF also requires special disposal methods. Thus, stringent precautions must be sustained when working with and disposing of HF. Additionally, HF fails to successfully remove some chemical stains such as ferric nitrate. Furthermore, HF can also damage the platen plates of CMP apparatus.

A multiplicity of disadvantages are also associated with the use of potassium hydroxide (KOH) for cleaning CMP apparatus. For one thing, KOH fails to successfully remove some chemical stains such as ferric nitrate. Additionally, KOH often leaves a residual composition of potassium, a mobile ion, on the apparatus and polishing pad that may contaminate semiconductor wafers thereby resulting in detrimental effects on the electrical performance of the device and a reduction in yield. Furthermore, KOH can also damage the platen plates and some of the material used to form shields of the CMP apparatus (typically Lexan). Although less dangerous to humans than HF, KOH is nevertheless caustic and requires care in handling and disposal.

Thus, there is a need for a cleaning composition for removing unwanted deposits from CMP apparatus that ameliorates or overcomes one or more of the shortcomings of the prior art. The cleaning composition of the present invention is substantially free of HF, KOH. Furthermore, the present invention does not make use of HCl, in contrast to the work of Thurman-Gonzalez et. al. (WO 99/23688).

BRIEF SUMMARY OF THE INVENTION

The present invention relates to chemical compositions and methods of use for cleaning CMP equipment, including the interiors of delivery conduits for carrying CMP slurry to the necessary sites. The chemical compositions of the present invention are also useful for post-CMP cleaning of the wafer itself.

Three classes of cleaning compositions are described, all of which are aqueous solutions. One class operates in a preferable pH range from about 11 to about 12 and preferably contains one or more non-ionic surfactants, one or more simple amines, a surfactant or sticking agent, such as one or more soluble dialcohol organic compounds and one or more quaternary amines. A second class of cleaning composition operates in a preferable pH range of approximately 8.5 and contains one or more of lactic acid, citric acid and oxalic acid. A third class of compositions is acidic, having a preferable pH range from about 1.5 to about 3, preferably containing at least one oxidizing acid, at least one chelating agent, at least one sticking agent and at least one anionic surfactant. HF and KOH are substantially absent from the preferred compositions of the present invention.

Some compositions of the present invention are shown to be advantageously used for cleaning the slurry distribution system of CMP apparatus.

Among the advantages of the present cleaning compositions are those set forth below.

One advantage of the cleaning compositions according to the present invention is that they clean better than cleaning compositions based upon both HF and KOH.

Another advantage of the cleaning compositions according to the present invention is that they are compatible with the typical plastic and metal parts of the CMP apparatus and thus are not as aggressive as HF and KOH in attacking the materials of the CMP apparatus.

A further advantage of the cleaning compositions according to the present invention is that they are far less acidic than HF.

Another advantage of the cleaning compositions according to the present invention is that they ameliorate environmental disposal restrictions related to HF.

A further advantage of the cleaning compositions according to the present invention is that, lacking compounds capable of releasing potassium ions, they do not leave a residual composition of potassium material on the apparatus as occurs with the use of KOH.

Yet another advantage of the cleaning compositions according to the present invention is that they tend to loosen residues thereby reducing the required manual labor. In some cases, the requirement of using a tool such as a spatula for scraping off residues from CMP apparatus is eliminated.

Another advantage of the cleaning compositions according to the present invention is that they typically require merely the use of a sponge, which does not have to be a SCOTCH bright sponge or the like, for removing residues. This tends to eliminate scratches to the CMP apparatus caused by cleaning with much harder and grittier sponges typically used heretofore.

Yet another advantage of the present invention is the ability to clean residue from the interior surfaces of the CMP slurry distribution system.

Another advantage of the present invention is the absence of abrasives.

BRIEF DESCRIPTION OF THE DRAWINGS

This application has no drawings.

DETAILED DESCRIPTION OF THE INVENTION

Several compositions are shown to be useful in the practice of the present invention as cleaning agents for CMP equipment. These compositions can be used singly or in combination, and applied to various regions of the CMP apparatus requiring cleaning as specified herein or determined by routine experimentation on specific deposits.

COMPOSITION A

One composition pursuant to the present invention ("Composition A") comprises one or more non-ionic surfactants, one or more simple amines, one or more soluble dialcohol organic compounds (or other substance compatible with the composition and functioning as a surfactant or sticking agent), and one or more quaternary amines, in an aqueous solution. The aqueous solution typically comprises de-ionized ("DI") water.

The non-ionic surfactant should be soluble in the composition and compatible with the pH ranges of the composition. Additionally, it is important that the cloud point of the surfactant be such as not to render the surfactant unstable when used in the cleaning composition. One non-ionic surfactant found useful in the present invention is 3,5-dimethyl 1-hexyn-3-ol, the structure of which is given by the following:

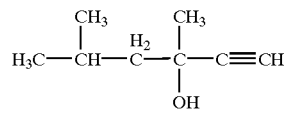

3,5-dimethyl 1-hexyn-3-ol

One useful commercial form of the above non-ionic surfactant is sold by Air Products and Chemicals, Inc. under the tradename Surfynol® 61. Other surfactants sold under Surfynol® tradenames include mono- and di-hydroxy compounds such as 3,6-dimethyl-4-octyne-3,6-diol (Surfynol® 82), 3,6-dimethyl-4-octyne-3,6-diol on an amorphous silica carrier (Surfynol® 82S) and tetramethyl decynediol (Surfynol® 104).

Monoethanolamine (MEA), or related primary amines, are useful in the practice of the present invention so long as the particular amine compound is sufficiently soluble in the cleaning composition. Other functional groups may be present at the amine end of the molecule. Examples of such additional functional groups include hydroxyl, acid or ester functionality and other amine groups (diamine, etc.) so long as the primary amine nature of the molecule is preserved. Amines having from 1 to about 8 carbons are useful in the practice of the present invention although the volatility of typical $C_1$ amines is a possible disadvantage. The preferable range is $C_2$–$C_6$, tending to offer a good balance of non-volatility and solubility in the composition. Hydroxyl functionality on the molecule is advantageous.

Propylene glycol may be used as a surfactant or sticking agent in the practice of the present invention. Other such agents include dialcohol organic compounds such as ethylene glycol and the like so long as adequate solubility in the composition is present. Polymeric species such as polyethylene oxide or polypropylene oxide may be used so long as these polymeric species are adequately soluble in the composition and precipitation problems in the composition are absent (which is the typical situation occurring with reasonably low molecular weight species).

Tetramethylammonium hydroxide (TMAH) is typically used to adjust the pH of the composition. The present cleaning composition may have a pH in the range from about 10 to about 12.5 although the range from about 11 to about 12 is preferred. Variations of the present composition containing greater or lesser amounts of MEA may also be used. A typical mixture for Composition A follows:

Typical Composition A Proportions

| Solution | Grams |
| --- | --- |
| DI water | 4700 |
| Surfynol ® 61 | 60 |
| Monoethanolamine (MEA) | 300 (@ 100% solution) |
| Propylene Glycol | 900 |
| Tetramethylammonium Hydroxide (TMAH) | 4 |

Composition A is particularly useful for silica based slurry systems wherein the CMP apparatus is exposed to silica, water and perhaps hydrogen peroxide type of residues.

Moreover, and surprisingly, it was found that the Composition A worked on a wide variety of residues including iron nitrate, alumina and silica residues and worked irrespective of whether copper polishing, tungsten polishing or silica polishing had been performed.

Furthermore, Composition A also may be used to some degree and under certain conditions for cleaning semiconductor wafers. For example, Composition A can be used to clean semiconductor wafers after they are polished. Normally, a wafer coming off a polishing apparatus is still wet and the particles disposed thereon are not dry so that Composition A can be used to remove them. Hence, Composition A can be used in both a wet and a dry environment.

Preparation

Normally, the Composition A is prepared by first preparing a container of DI water to which the non-ionic surfactant (typically, Surfynol® 61) is added. Then, MEA is added followed by the addition of propylene glycol. These are all liquids that they all dissolve and mix quite well simply with stirring. The pH is then measured with a pH probe and TMAH is incrementally added to obtain a final pH which is a preferably above about 11 but below about 12. These liquids are preferably continuously stirred within the container during at least the time period during which the composition is prepared.

The container is typically an open-top container such as a beaker or bucket and is typically made of a plastic type of material such as polypropylene, polyethylene, or the like. Stainless steel containers, black iron and glass containers should be avoided. Glass containers are known in some cases to leach sodium into the solution contained therein, which is disadvantageous in the practice of the present invention.

COMPOSITION B

Another composition that was found to remove particles and metal ion contamination is comprised of DI water, at least one of oxalic acid, citric acid, and lactic acid, and one or more quaternary amines, such as choline hydroxide, tetramethylammonium hydroxide (TMAH), etc. This composition can be used to remove particles, metal oxide and other metal salt contamination from CMP apparatus and also can be employed to remove these same contaminants from wafers polished with CMP slurries. The polished wafers can include copper and tungsten.

Additionally, it has been found that this Composition B is especially effective at removing iron, copper, zinc, potassium and calcium contaminates.

Typical Composition B Proportions (I)

| Solution | Grams |
| --- | --- |
| DI water | 658 |
| Citric Acid | 28 |
| Lactic Acid | 15.4 (@ 91% solution) |
| Tetramethylammonium Hydroxide (TMAH) | 206.2 (@ 25% solution in water) |

Typically, tetramethylammonium hydroxide is used to adjust the pH of Composition B(I) to a desired final value. Composition B(I) has a pH of preferably about 8.5.

Typical Composition B Proportions (II)

| Solution | Grams |
| --- | --- |
| DI water | 2,657.90 |
| Citric Acid | 115.15 |
| Lactic Acid | 63.35 |
| Choline (two step addition, 618 gms + 45.6 gms) | 663.60 |

Typically, choline is used to adjust the pH of Composition B (II) to a desired final value. Composition B(II) has a pH of preferably about 9.0 and is stable during storage.

Preparation

Composition B(II) is typically prepared as described herein, with modifications apparent to those having ordinary skills in the art. Preparation of Composition B(I) is analogous.

Typically, the required amount of DI water is added to a container, noting the weight and pH of the DI water. The first addition of choline is then typically performed, preferably with simultaneous stirring for a period of time, typically approximately 10 minutes. The pH and temperature of the solution is typically noted and recorded. It is expected that the pH is greater than about 13 following this first addition of choline, and that the temperature of the solution will be slightly lower than prior to addition of the choline. Next, lactic acid is typically added (for example, about 1.8% by weight), with simultaneous stirring over a period of approximately 10 minutes. It is expected that the pH will still exceed about 13 and the temperature will increase somewhat. While stirring, citric acid is added to the solution, typically about 3.29% by weight. After about 10 minutes of stirring, a temperature rise is expected and the pH will typically drop to approximately 6.5. The second addition of choline is performed in sufficient mount to obtain the desired pH. Typically a pH of 9.0 is desired although a pH of 8.5 may also be used in the production of the present compositions. Small amounts of citric acid can be added to the solution to increase the pH if the added choline reduces the pH too much, lying on the alkaline side of the desired pH.

COMPOSITION C

Another composition (Composition C), which is typically somewhat acidic, comprises DI water, hydroxylamine nitrate (HAN), a mild oxidizing acid in comparison with nitric acid or oxalic acid (as an agent for chelating the iron residues that may be found on CMP apparatus), and an anionic surfactant, typically DOWFAX 8292 surfactant, and propylene glycol which acts as a sticking agent so that the cleaning composition will stay in place for an effective period of time before draining off the apparatus. Additionally, and in general, DOWFAX 8292 surfactant is a sulfonic acid of a phenolic system. Composition C. with its HAN and oxalic acid components, was designed particularly to remove iron residues from CMP apparatus.

Furthermore, Composition C also has utility in cleaning semiconductor wafers to some degree and under certain conditions. For example, Composition C can be used to clean semiconductor wafers after they are polished. Normally, a wafer coming off a polishing apparatus is still wet and the particles disposed thereon are not dry so that Composition C can be used to remove them. Hence, Composition C can be used in both a wet and a dry environment. Typical Composition C Proportions

| Solution | Grams |
|---|---|
| DI water | 3,436.11 |
| Hydroxylamine Nitrate (HAN) | 178 |
| | (@ 82% solution) |
| Oxalic Acid | 130 |
| DOWFAX 8292 surfactant | 0.89 |
| Propylene Glycol | 660 |

Composition C has a general pH range from about 1 to about 4 and a preferred range from about 1.5 to about 3.

Preparation

Normally, Composition C is prepared by first adding DI water into a container. HAN is then added to the DI water. Next, oxalic acid is added which is then followed by the addition of the DOWFAX 8292 surfactant. Finally, propylene glycol is added. These liquids are preferably continuously stirred within the container during at least the composition preparation.

The container is typically an open-top container such as a beaker or bucket and is typically made of a plastic type of material such polypropylene, polyethylene, or the like. Stainless steel containers, black iron and glass containers should be avoided. Glass containers are known to leach sodium into the composition.

HAN is a fairly stable material and thus, substitution of a less stable material such hydrogen peroxide would be disadvantageous. Nitric acid may be used but is not expected to be as efficient as HAN. Hydrochloric acid may be used but it has the disadvantage of possibly being corrosive to portions of the CMP apparatus. Sulfuric or phosphoric acid could also perhaps be used. However, these acids are not as good as an oxidizer in dilute solutions as HAN. Moreover, the mild oxidizing acid (HAN) is preferred according to the present invention.

Oxalic acid is a chelating agent and as such, any chelating material that effectively binds iron (or other by products of the CMP process such as copper, tungsten, and iridium or other metal that might be polished) could be employed in this formulation in place of (or in addition to) oxalic acid. For example, citric acid may replace or supplement oxalic acid as a chelating agent.

DOWFAX is an anionic surfactant and any surfactant that has adequate solubility in this formulation and at this pH should be acceptable for use with this invention.

Ethylene glycol or some other dialcohol organic compound may be used in addition to (or in place of) propylene glycol as long as the compounds are adequately soluble in the present cleaning solution. Additionally, polymer forms may be used. For example, polyethylene oxide or polypropylene oxide may be used as long as the molecular weight is low enough such that there will be no precipitation problems occurring in the formulation by the introduction and use of such polymers.

TYPICAL USE OF CLEANING COMPOSITIONS

When a user has completed the actual wafer polishing work for a number of semiconductor wafers (CMP), or perhaps when the user is getting ready to change out or replace the polishing pad, the cleaning compositions according to the present invention are preferably sprayed onto the various surfaces of the CMP apparatus which are desired to be cleaned. The surfaces thus sprayed are then allowed to stand for a period of time (e.g. from about 10 to about 30 minutes) to loosen up the residues disposed thereon. The various surfaces of the CMP apparatus are then wiped down with, for example, a polyurethane (or PVA) pad or sponge that preferably includes disposed thereon an amount of the cleaning composition according to the present invention. The various surfaces are then thoroughly rinsed down, typically with DI water.

Additionally, Composition C, which is acidic, can be used to clean and remove deposits from slurry distribution systems. Specifically, Composition C can be used to clean and remove deposits of ferric nitrate $Fe(NO_3)_3$ from distribution systems that typically include at least one slurry holding means and associated distribution conduits running to individual CMP apparatus.

In use, Composition C is pumped through the distribution system in an amount to at least provide minimum pump volumes. Composition C is typically pumped through the slurry distribution system for a period of time, perhaps one or more hours, in which all the conduits or lines are essentially flushed out. Next, distilled water may be pumped through the distribution system to flush out Composition C. However, is should be noted that the distilled water step may not be necessary as a result of Composition C being acidic and having a pH and an oxidizer system that is compatible with the ferric nitrate $Fe(NO_3)_3$ slurries. That is, the ferric nitrate $Fe(NO_3)_3$ slurries will typically remain in an oxidized form when in contact with post-cleaning residual amounts of Composition C, even absent a DI rinse. Notwithstanding, it is considered preferable in the practice of the present invention to employ a final distilled water flush of the distribution system.

Having described the invention in detail, those skilled in the art will appreciate that, given the present disclosure, modifications may be made to the invention without departing from the spirit of the inventive concept described herein. Therefore, it is not intended that the scope of the invention be limited to the specific and preferred embodiments illustrated and described.

We claim:

1. A composition for removing chemical-mechanical planarization residue, comprising:
   an aqueous solution comprising:
   at least one non-ionic surfactant;
   at least one simple amine;
   at least one sticking agent selected from a group consisting of ethylene glycol, propylene glycol, polyethylene oxide, polypropylene oxide, and any mixture thereof; and
   at least one quaternary amine, wherein said solution has a pH of from about 10 to about 12.5.

2. A composition as in claim 1 wherein HF and KOH are substantially absent.

3. A composition as in claim 1 wherein said at least one non-ionic surfactant is selected from a group consisting of a monohydroxyl compound, a dihydroxyl compound, and any mixture thereof.

4. A composition as in claim 3 wherein said at least one non-ionic surfactant is 3,5-dimethyl 1-hexyn-3-ol.

5. A composition as in claim 1 wherein said at least one simple amine has from 1 to about 8 carbon atoms.

6. A composition as in claim 5 wherein said at least one simple amine has from 1 to 6 carbon atoms.

7. A composition as in claim 5 wherein said at least one simple amine has hydroxyl functionality.

8. A composition as in claim 7 wherein said at least one simple amine is monoethanolamine.

9. A composition as in claim 1 wherein said at least one sticking agent is a dialcohol organic compound.

10. A composition as in claim 1 wherein said at least one quaternary amine is tetramethylammonium hydroxide.

11. A composition as in claim 1 wherein said pH is from about 11 to about 12.

12. A method of cleaning residue from a chemical-mechanical planarization slurry distribution system, comprising:

flowing a composition comprising an aqueous solution of at least one oxidizing acid, at least one chelating agent, at least one sticking agent, and at least one anionic surfactant, through said slurry distribution system for a time sufficient to loosen residue from said slurry distribution system.

13. A method as in claim 12 further comprising, after said flowing, rinsing said system.

14. A method of cleaning residue from a chemical-mechanical planarization system, comprising:

applying a composition comprising an aqueous solution of at least one oxidizing acid, at least one chelating agent, at least one sticking agent, and at least one anionic surfactant, to at least a part of said system for a time sufficient to loosen residue from said part; and rinsing said part.

* * * * *